(12) United States Patent
Takashi et al.

(10) Patent No.: US 7,268,707 B2
(45) Date of Patent: Sep. 11, 2007

(54) CODING DEVICE AND DECODING DEVICE

(75) Inventors: Terumi Takashi, Kanagawa (JP); Yoshiju Watanabe, Kanagawa (JP); Morishi Izumita, Tokyo (JP); Yasuyuki Itou, Kanagawa (JP)

(73) Assignee: Hitachi Global Storage Technologies Netherlands B.V., Amsterdam (NL)

( * ) Notice: Subject to any disclaimer, the term of this patent is extended or adjusted under 35 U.S.C. 154(b) by 0 days.

(21) Appl. No.: 11/394,531

(22) Filed: Mar. 30, 2006

(65) Prior Publication Data

US 2006/0220931 A1    Oct. 5, 2006

(30) Foreign Application Priority Data

Mar. 30, 2005    (JP)    ............... 2005-099829

(51) Int. Cl.
*H03M 7/00*    (2006.01)

(52) U.S. Cl. .......................................... 341/59; 341/50

(58) Field of Classification Search ............. 341/50–90
See application file for complete search history.

(56) References Cited

U.S. PATENT DOCUMENTS

| | | | |
|---|---|---|---|
| 4,754,492 A * | 6/1988 | Malvar ....................... | 382/268 |
| 6,335,841 B1 * | 1/2002 | Hirano et al. ................ | 360/40 |
| 6,557,124 B1 | 4/2003 | Cideciyan et al. | |
| 6,681,362 B1 * | 1/2004 | Abbott et al. ................ | 714/755 |
| 6,681,382 B1 * | 1/2004 | Kakumani et al. ........... | 717/122 |
| 6,704,154 B2 * | 3/2004 | Hirano et al. ................ | 360/40 |

\* cited by examiner

*Primary Examiner*—Lam T. Mai
(74) *Attorney, Agent, or Firm*—Townsend and Townsend and Crew LLP; Patrick Duncan

(57) ABSTRACT

Embodiments of the invention allow relatively simple circuits to provide a coding device capable of coding longer bit-length data suitably for disk apparatus and a decoding device capable of decoding the data coded by the coding device. In one embodiment, a coding device comprises: a coder which, based on an M bits code string, produces an (M+1) bits coded string where each of the plural bits which may appear in the M bits code string is limited in run length; a preprocessor which produces an M bits code string by removing (N−M) bits respectively from predefined (N−M) positions of an incoming N bits code string and outputs the M bits code string to the coder; and a postprocessor which produces and outputs an (N+1) bits code string by inserting the (N−M) bits, which are removed by the preprocessor, into predefined (N−M) respective insertion positions of the (M+1) bits coded string output from the coder.

19 Claims, 4 Drawing Sheets

| bit | 0 | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 |
|---|---|---|---|---|---|---|---|---|---|---|---|---|---|---|---|---|---|---|---|---|---|---|---|---|---|
| 1Run | 2 | 4 | 4 | 4 | 4 | 4 | 4 | 3 | 3 | 3 | 3 | 4 | 4 | 4 | 4 | 4 | 4 | 4 | 4 | 4 | 3 | 2 | 4 | 3 |
| 0Run | 6 | 10 | 10 | 9 | 8 | 10 | 10 | 10 | 10 | 10 | 10 | 9 | 8 | 10 | 10 | 9 | 8 | 7 | 6 | 12 | 11 | 10 | 9 | 8 | 7 |

CODING DEVICE AND DECODING DEVICE

CROSS-REFERENCES TO RELATED APPLICATIONS

This application claims priority from Japanese Patent Application No. JP2005-099829, filed Mar. 30, 2005, the entire disclosure of which is incorporated herein by reference.

BACKGROUND OF THE INVENTION

The present invention relates to a coding device and decoding device for use in hard disk and other storage apparatus.

Recently, the so-called PRML (Partial Response Maximum Likelihood) system is widely used for recording and reproducing in magnetic disk and other storage apparatus. In the PRML system, a partial response (PR) channel is combined with Viterbi coding.

The reproduction circuit is assumed as a channel with, for example, the Partial Response Class 4 (PR4) transfer function. The PR4 is expressed by $G(D)=(1-D)(1+D)$ wherein D is the delay operator. For higher density recording, it is known that higher order partial responses such as Enhanced Partial Response Class 4 (EPR4) of $G(D)=(1-D)(1+D)^2$, Enhanced EPR4 of $G(D)=(1-D)(1+D)^3$ and MEEPR4 (Modified Enhanced EPR4) of $G(D)=(1-D)^2(5+4D+2D^2)$ are suitable.

Thus, in magnetic recording, a binary code is converted to a three-, five- or seven-duration-correlated signal. The binary code composed of bit "1" and "0" is reproduced from this three-, five- or seven-duration-correlated signal sequence through Viterbi decoding.

In the magnetic disk apparatus, recorded data is reproduced by this PRML method from the signal read from the magnetic recording medium by the magnetic head which moves on the magnetic recording medium. The data sampling timing is also obtained from the read signal.

In this case, if long bit stream of "0" or "1" consecutive data bits come, the voltage of the read signal becomes at around 0 V, making it difficult to pick up the sampling timing.

Therefore, before recording is performed in most magnetic disk apparatus, conversion is made to a code where the maximum run length of "0" is constrained. As such codes, 8/9 GCR and 16/17 GCR codes have been known widely. In the case of Viterbi decoding, however, the decoding error probability is subject to the inter-symbol distances of the recorded code. It is therefore preferable to construct a code with both short run lengths and long inter-symbol distances. In this regard, the above-cited GCR codes are not appropriate.

Although it is generally difficult to construct a short run length and long inter-symbol distance code, it is found possible to encode 16 bits of data to 17 bits so as to constrain the maximum run lengths of "1" and "0" to 3 and 10 respectively. This code is called a 16/17 QMTR (Quasi-Maximum Transition Run) code. See Patent Document 1 (Japanese Patent Laid-open No. 11-243345).

In a disk apparatus using this 16/17 QMTR, the data to be recorded is given error correction code and the resultant code sequence including the error correction code is divided into strings of 16 bits each. Each 16-bit long code string is converted to 17-bit coded data by the 16/17 QMTR coding for recording.

BRIEF SUMMARY OF THE INVENTION

To raise the performance of a disk apparatus, it is preferable to maximize the number of data bits to be coded at a time or the amount of data to be processed at a time. As described earlier, however, it is generally very difficult to construct, for example, a 20/21 QMTR code to encode 20-bit data into 21-bit data. In addition, even if such a code is constructed, this would require a large scale circuit. It is not considered practical to design a circuit capable of appropriately performing such long bit-length coding as 20/21 QMTR coding.

The present invention has been made in view of the above-mentioned situation. It is a feature of the present invention to allow relatively simple circuits to provide a coding device capable of coding longer bit-length data suitably for disk apparatus and a decoding device capable of decoding the data coded by the coding device.

To solve the above-mentioned problem of the related art ones, the present invention provides a coding device comprising: a coder which, based on an M bits code string, produces an (M+1) bits coded string where each of the plural bits which may appear in the M bits code string is limited in run length; a preprocessor which produces an M bits code string by removing (N−M) bits respectively from predefined (N−M) positions of an incoming N bits code string and outputs the M bits code string to the coder; and a postprocessor which produces and outputs an (N+1) bits code string by inserting the (N−M) bits, which are removed by the preprocessor, into predefined (N−M) respective insertion positions of the (M+1) bits coded string output from the coder.

DETAILED DESCRIPTION OF THE INVENTION

Figure 1:
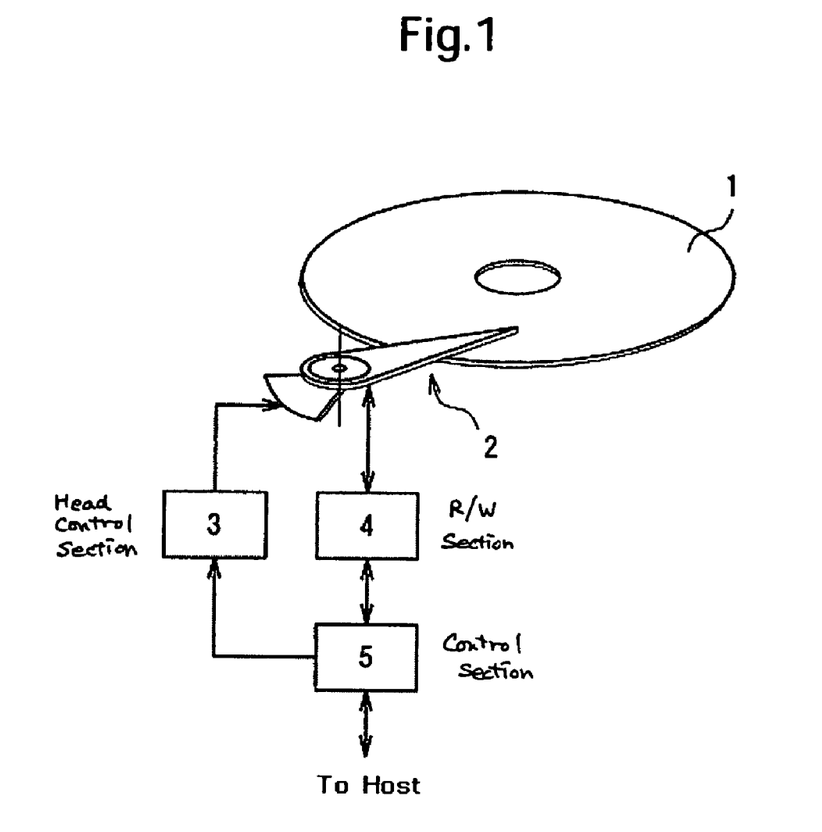
FIG. 1 is a block diagram showing the general configuration of a disk apparatus according to an embodiment of the present invention.

The following will describe embodiments of the present invention with reference to the drawings. A coding device and a decoding device of the embodiments are incorporated in a disk apparatus. A specific example of a disk apparatus incorporating a coding device and a decoding device of the present embodiments comprises a disk medium 1, a head assembly 2, a head control section 3, a read write (RW) section 4 and a control section 5 as shown in FIG. 1. FIG. 1 shows the general configuration of the disk apparatus.

Having a magnetic head, the head assembly 2 relatively moves on the surface of the disk medium 1 to perform access to the disk medium 1 in order to magnetically reproduce/record (read/write) information.

The head control section 3 controls the head assembly 2 to move the magnetic head on the disk medium 1.

The RW section 4 codes the signal incoming from the control section 5 and outputs the coded information to the magnetic head of the head assembly 2 as an electric signal. In addition, the RW section 4 decodes recorded information according to the electric signal incoming from the magnetic head and outputs the decoding result to the control section 5. The RW section 4 includes the coding device and decoding device of the present embodiment. Processing by the RW section 4 will be described later in detail.

The control section 5 is, for example, a microprocessor which operates according to a program stored in a memory device not shown in the figure. Information to be recorded is received by this control section 5 from the host computer of the disk apparatus and output to the RW section 4. In addition, if instructed by the host computer to read information recorded on the disk medium 1, the control section 5 instructs the head control section 3 to move the magnetic head to a position where the information is recorded, receives the decoding result signal from the RW section 4 and outputs the signal to the host.

Given that the disk apparatus is connected to a host computer, if instructed by the host to record information, the control section 5 outputs the information to the RW section 4 according to the instruction. The RW section 4 codes the information and outputs the generated electric signal to the head assembly 2. The magnetic head of the head assembly 2 converts the electric signal to a magnetic signal to record the information by magnetizing the disk medium 1.

If instructed by the host to read information recorded on the disk medium 1, the control section 5 instructs the head control section 3 to move the magnetic head to a position from which information is to be read. The head control section 3 controls the head assembly 2 so as to move the magnetic head to the specified position on the disk medium 1. Information read by the magnetic head from that position is output to the RW section 4 in which the information is decoded before output to the control section 5. The control section 5 outputs the decoded information to the host.

Figure 2:
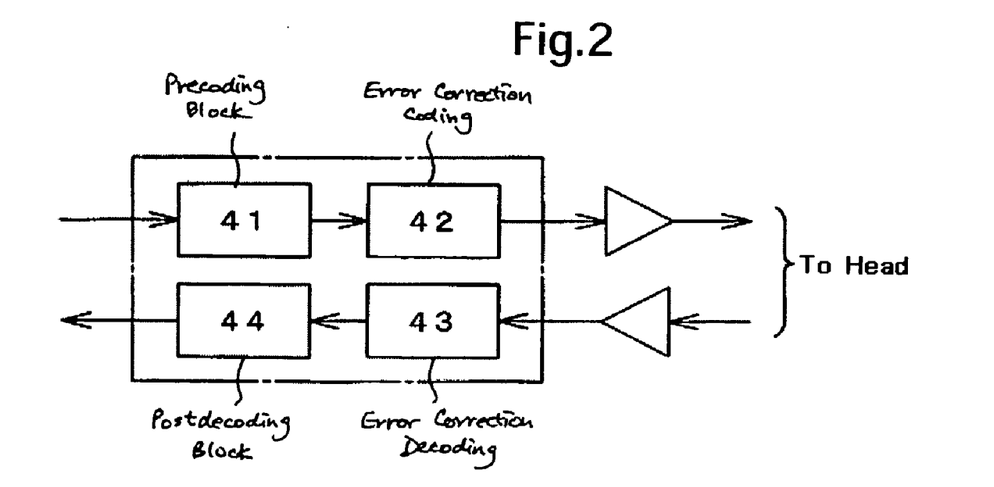
FIG. 2 is a functional block diagram of a read write section.

The following describes how the RW section 4 operates to implement a coding device and a decoding device of the present embodiment. The RW section 4 can be realized by using a CPU or DSP (Digital Signal Processor) which executes a program. Functionally, the RW section 4 comprises a precoding block 41, an error correction coding block 42, an error correction decoding block 43 and a postdecoding block 44 as shown in FIG. 2.

Figure 3:
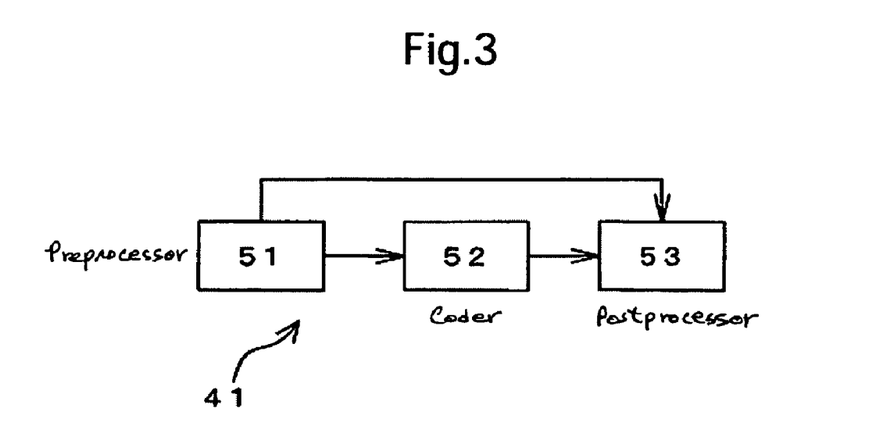
FIG. 3 is a functional block diagram of a precoding block.
Figure 4:
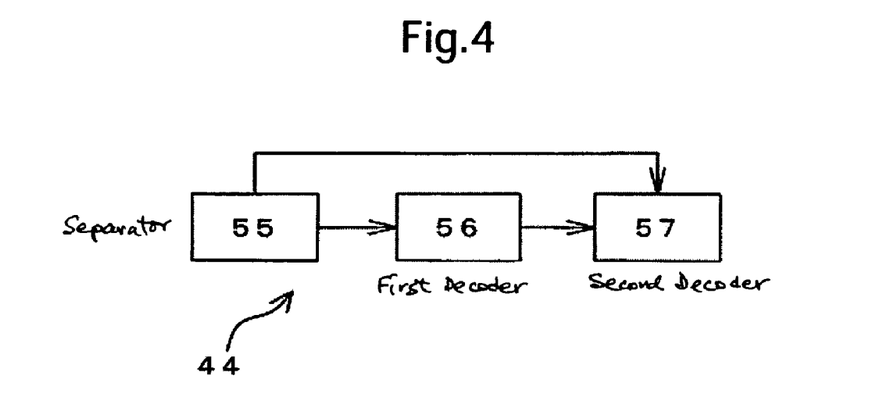
FIG. 4 is a functional block diagram of a postdecoding block.

Further, the precoding block 41 comprises a preprocessor 51, a coder 52 and a postprocessor 53 as shown in FIG. 3. The postdecoding block 44 comprises a separator 55, a first decoder 56 and a second decoder 57 as shown in FIG. 4.

The preprocessor 51 in the precoding block 41 divides the incoming code into N bits code string to be processed. Then, the preprocessor 51 removes (N–M) bits from each N bits code string to produce a M-digit bits code string for output to the coder 52 where M is smaller than N. The locations of the (N–M) bits to be removed are predefined.

The coder 52 is a conventionally used M/(M+1) QMTR coding circuit such as a 16/17 QMTR coding circuit. This coder 52 converts each M bits code string, incoming from the preprocessor 51, to an (M+1) bits code string while constraining the run length of each digit state.

In the postprocessor 53, the (N–M) bits removed by the preprocessor 51 are respectively inserted into predefined (N–M) positions of the (M+1) bits code string to produce and output a (N+1) bits code string. The postprocessor 53 may also be designed to add an error correction symbol to this (N+1) bits code string.

Figure 5:
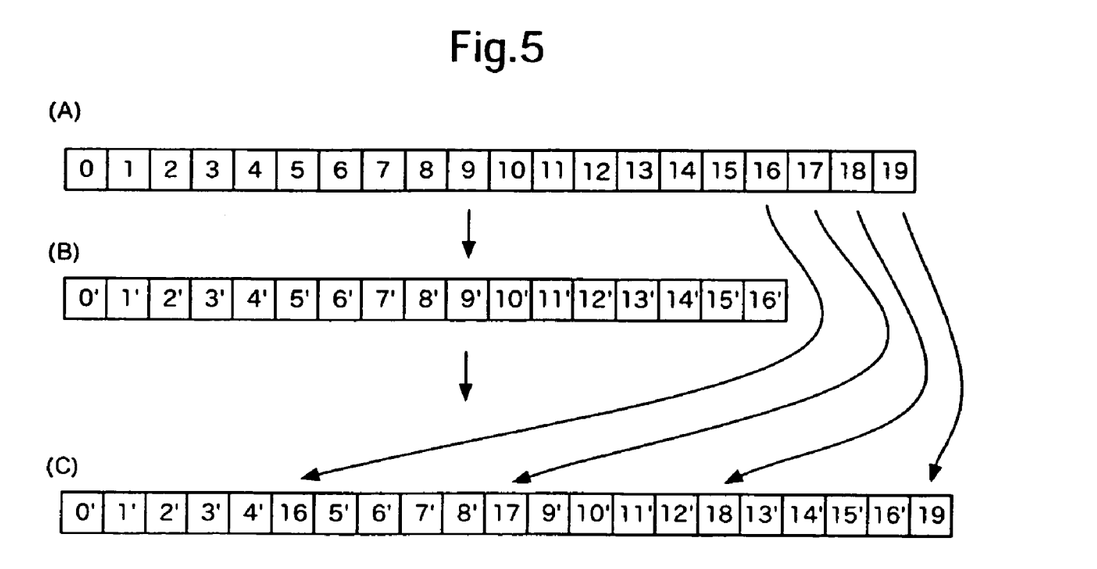
FIG. 5 illustrates an example of operation by a coding device according to an embodiment of the present invention.

With reference to FIG. 5, the following provides a detailed description of how the precoding block 41 operates. Assume that N and M are respectively 20 and 16 in bits. The precoding block 41 splits the incoming code sequence into N bits string (20-bit strings here). Of each 20-bit long code string (20 bits "0" through "19" shown FIG. 5(A)), predefined (N–M) bits, namely 4 (=20–16) bits are removed. By performing 16/17 QMTR coding on the resultant 16-bit long code string, the precoding block 41 produces a 17-bit long code string ("0'" through "16'") as shown in FIG. 5(B).

Then, the removed (N–M) bits are respectively inserted into predefined (N–M) positions of this 17-bit long code string. For example, if the insertion positions immediately follow digits "4'", "8'", "12'" and "16'" respectively, this operation produces such a code as shown in FIG. 5(C). The precoding block 41 outputs this code string to the error correction coding block 42.

These insertion positions may be determined so as to sandwich at least a certain number of digits therebetween. If the coder 52 constrains the maximum run length of value "1" to 3, the maximum run length of value "1" in the code string, after insertion is made, can be constrained to 4 (=3+1) given that the distance between insertion positions is larger than the maximum run length (=3 for one state "1").

That is, this precoding block 41 operates as a 20/21 MTR (Maximum Transition Run) coder.

The precoding block 41 performs the above-mentioned processing on each N bits code string obtained by division. (N+1) bits code strings obtained by this coding are respectively given error correction bits and output sequentially.

The error correction coding block 42 concatenates code strings incoming sequentially from the precoding block 41, performs error correction coding on the concatenated code string and outputs the result.

The error correction decoding block 43 in the RW section 4 performs PRML processing and error correction decode processing on an electric signal picked up by the magnetic head and outputs the decoded information. The information output from this error correction decoding block 43 is concatenated code strings output by the precoding block 41.

The separator 55 in the post decoding block 44 divides a code sequence, incoming from the error correction decoding block 43, into (N+1)-digit bits code strings which correspond to those output from the precoding block 41. Then, predefined digits are removed from each (N+1)-digit bits code string obtained by division and a resultant (M+1)-digit bits code string is output. The predefined digits correspond to the insertion positions into which insertion is made by the postprocessor 53 of the precoding block 41.

The first decoder 56 performs M/(M+1) QMTR decoding on each (M+1) bits code string output from the separator 55 and outputs the produced M bits code string. In the second decoder 57, the (N–M) bits removed by the separator 54 are respectively inserted into predefined (N–M) positions of the M bits code string output from the first decoder 56. These insertion positions correspond to those to which insertion is made by the preprocessor 51 of the preceding block 41.

Figure 6:
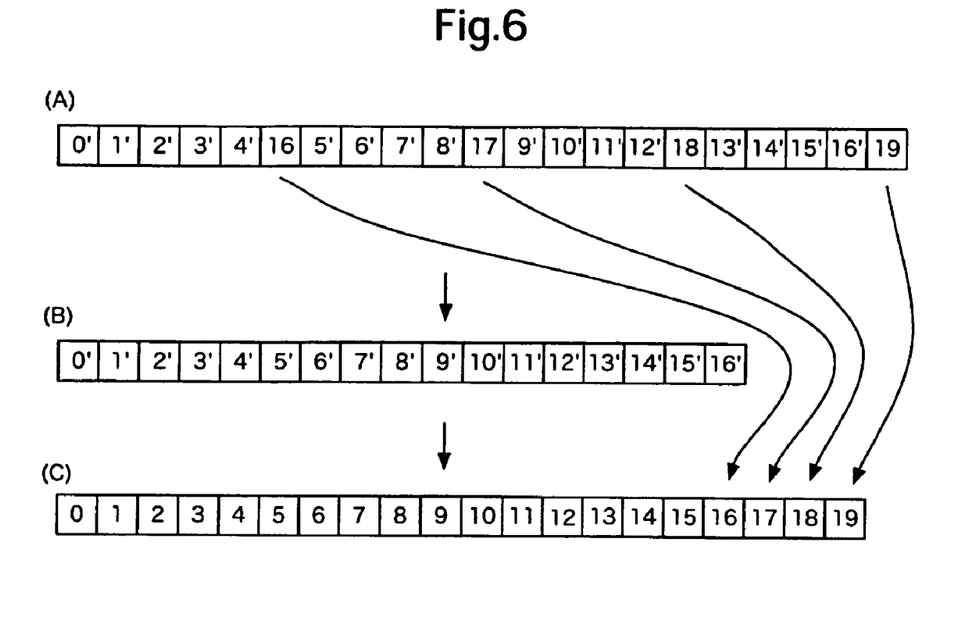
FIG. 6 illustrates an example of operation by a decoding device according to an embodiment of the present invention.

With reference to FIG. 6 as a specific example, the following describes how this postdecoding block 44 operates. As shown in FIG. 6(A), the code string incoming to the postdecoding block 44 corresponds to the (N+1) bits code string (shown in FIG. 5(C)) produced by the precoding block 41. N=20 and M=6 are assumed here in accordance with the above-described example.

In the postdecoding block 44, the insertion bits (four bits here) inserted by the post processor 53 of the precoding block 41 are removed and 16/17 QMTR decoding is performed on the produced 17-bit long code string to obtain a 16-bit long code string shown in FIG. 6(B).

Further, the postdecoding block 44 inserts the removed four bits into predefined positions of this 16-bit long code string. These insertion positions (at end of the code string in the example of FIG. 5) are identical to those into which insertion was made by the preprocessor 51 of the precoding block 41. The postdecoding block 44 produces a 20-bit long code string by this insertion and outputs it as a reproduced code string (FIG. 6(C)).

According to the present embodiment, it is possible to code a longer code string by designing such a circuit as a 16/17 QMTR coding circuit which is already used. This allows a relatively simple circuit to code larger bit-length data suitably for disk apparatus.

Conventionally, QMTR coding (RLL coding) where run lengths are limited is done after error correction code is added. If an error occurs in the read signal, QMTR decoding (RLL decoding) may propagate the error to a wider period. In the case of the present embodiment, since QMTR coding (RLL coding) is done before error correction code is added, it is possible to prevent QMTR decoding (RLL decoding) from causing error propagation.

Further, the precoding block 41 may be designed so as to refer to the end of its output code string and, if the end forms part of a catastrophic sequence (a sequence repeating " . . . 11001100 . . . "), perform catastrophic sequence removal processing. For example, the catastrophic sequence can be removed if the code pattern forming part of the catastrophic sequence is replaced by an unused pattern before coding is done.

Figure 7:
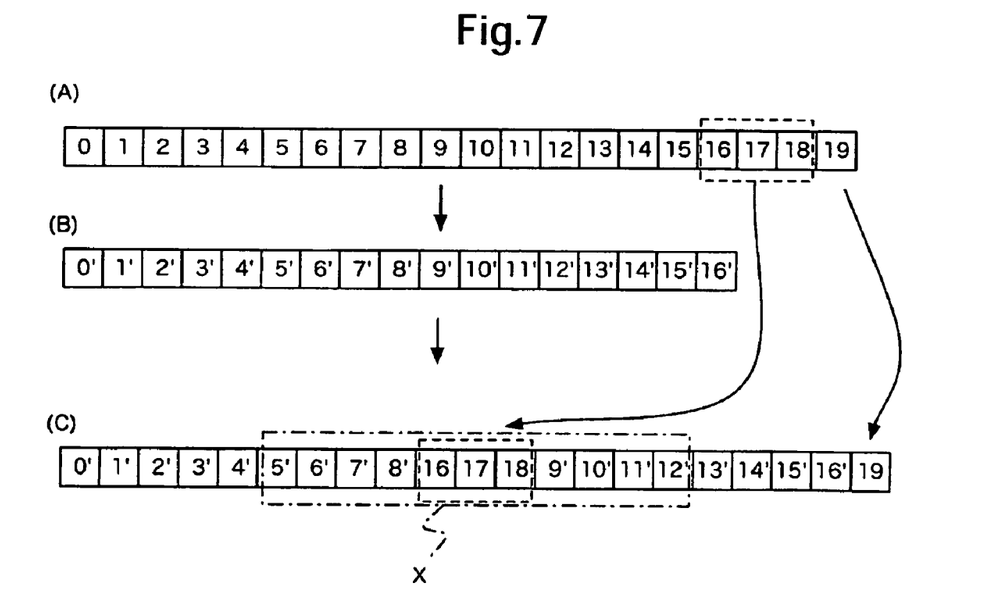
FIG. 7 illustrates another example of operation by the coding device of the embodiment of the present invention.

Further, the precoding block 41 of the present embodiment allows the following modification. For example, the post processor 53 may be designed so as to set multiple consecutive insertion positions after the 9th bit ("8") of the 16/17 QMTR coding result shown in FIG. 5. In this case, if four bits are removed by the preprocessor 51 (see FIG. 7(A)), they are inserted into the 16/17 QMTR coding result, for example, as its 10th through 13th bits. The postprocessor 53 may also be designed so that of the four bits removed by the preprocessor 51, three are inserted into the 16/17 QMTR coding result as its 1ot through 12 bits and the remaining one is concatenated to the end of the 16/17 QMTR coding result (see FIG. 7(C)).

If insertion positions are set as mutually adjacent positions or concatenated to the top or end of the QMTR coding result as in the above example, the precoding block 41 is designed to operate as described below.

A predefined L bits part of the QMTR coding result, including inserted digits, is re-coded by the precoding block 41. In the example of FIG. 7(A), the 11-bit long part (X) consisting of the sixth through sixteenth bits is re-coded.

This part to be re-coded is picked up and coded again by the precoding block 41. In this re-coding, the run length of each of plural possible states of each digit is constrained.

Since the length of the part is not changed by this re-coding, the re-coding result remains to be L bits. A common coding scheme can be used in this re-coding. The precoding block 41 outputs a code string obtained by replacing its target part of re-coding by the re-coding result.

Insertion positions may also be set at the top or end of the QMTR coding result. If insertion is made at the top of the QMTR coding result, an L bits code part which includes the end of the last code string output from the postprocessor 53 and the top of the current code string to be output from the postprocessor 53 is set as the re-coding target and re-coded as described above. This L bits code part is replaced by the re-coding result.

If insertion is made at the end of the QMTR coding result, an L bits code part which includes the end of the current code string to be output from the postprocessor 53 and the top of the next code string to be output from the postprocessor 53 is re-coded. This L bits code part is replaced by the re-coding result. In the example of FIG. 7, a 10-bit part consisting of the end bit or seventeenth bit of the current code string and the first through fifth bits of the next code string is assumed as the re-coding target part (not shown in the figure). In this re-coding, the run length of each of plural possible states of each digit is constrained as well.

In decoding the thus coded sequence, the code sequence output from the error correction decoding block 43 is divided by the separator 55 of the postdecoding block 44 into the (N+1) bits code strings which were output from the precoding block 41.

Then, the re-coded part of each (N+1) bits code string obtained by division is decoded by the separator 55 consistently with the re-coding scheme. The re-coded part is replaced by this decoding result.

Then, the separator 55 removes digits from the pre-defined insertion positions of each (N+1) bits code string and outputs an (M+1) bits code string. The pre-defined insertion positions correspond to those to which insertion was made by the postprocessor 53 of the precoding block 41. The subsequent processing by the first and second decoders 56 and 57 are the same as described above.

The preceding block 41 of the present embodiment may also be designed to operate as a 30/31 MTR using a 24/25 QMTR coder instead of a 20/21 QMTR coder using 16/17 QMTR coding. That is, the preprocessor 51 removes the last six bits from each 30-bit code string and obtains a 25-bit code string by performing 24/25 QMTR coding on the remaining 24-bit code string. Then, the six bits are inserted to pre-defined positions of this 25-bit code string to produce a 31-bit code string.

Figure 8:
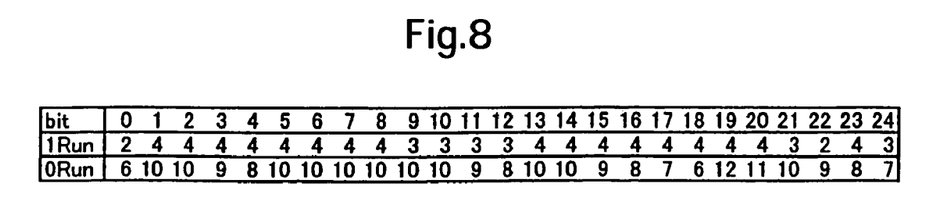
FIG. 8 illustrates an example of run lengths in 24/25 QMTR coding.

In this case, the insertion positions may be those corresponding to multiples of 4. In addition, they may be determined according to FIG. 8. In FIG. 8, the maximum run lengths of "0" and "1" in 24/25 QMTR coding are defined for each bit. If a run of "1" starts from the 0th bit, its maximum allowed run length is 2. Likewise, if a run of "1" starts from the 1st bit with the 0th bit of "0", its maximum allowed run length is 4.

Figure 9:
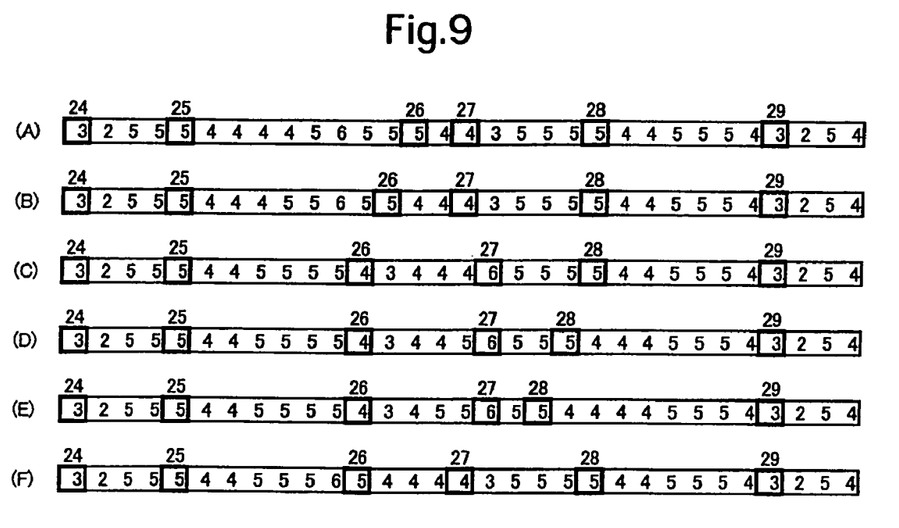
FIG. 9 illustrates an example of insertion positions with 24/25 QMTR coding.

Considering the nature of the coded string, six insertion patterns (A) through (F) are possible as shown in FIG. 9. Each number in (A) through (F) of FIG. 9 means the maximum run length of symbol "1". As apparent from FIG. 9, if any of the six insertion patterns is employed, it is possible to constrain the maximum run length of "1" to 6 and the number of parts containing the maximum run of "1", namely six "1s" in a row to 1.

The postprocessor 53 of the precoding block 41 maintains information regarding these six insertion rules and selects one insertion rule from the six insertion rules. Then, the digits removed by the preprocessor 51 are inserted into the coded string based on the selected rule. The postprocessor 53 may be designed to select a specific rule as predetermined.

Further, the error correction coding block 42 may be designed to add not only error correction code but also parity code to the code sequence which it produces and outputs. Since this allows errors to be corrected locally, the decoding performance can be raised. Practical implementation of this method is disclosed in "A New Target Response with Parity Coding for High Density Magnetic Recording Channels", Thomas Conway, IEEE Transactions on Magnetics, vol. 34, No. 4, July 1998.

Although it is assumed here that error correction coding is given individually to each unit of recording, namely a set of a certain size (e.g., 512 bytes) of user data and additional (CRCC and other) information, it is also possible to add an error correction code to each information set whose length is an integral multiple of the unit of recording. That is, it is possible to perform error correction coding in multiple units of information to be recorded while QMTR-coding the information to be recorded.

Figure 10:
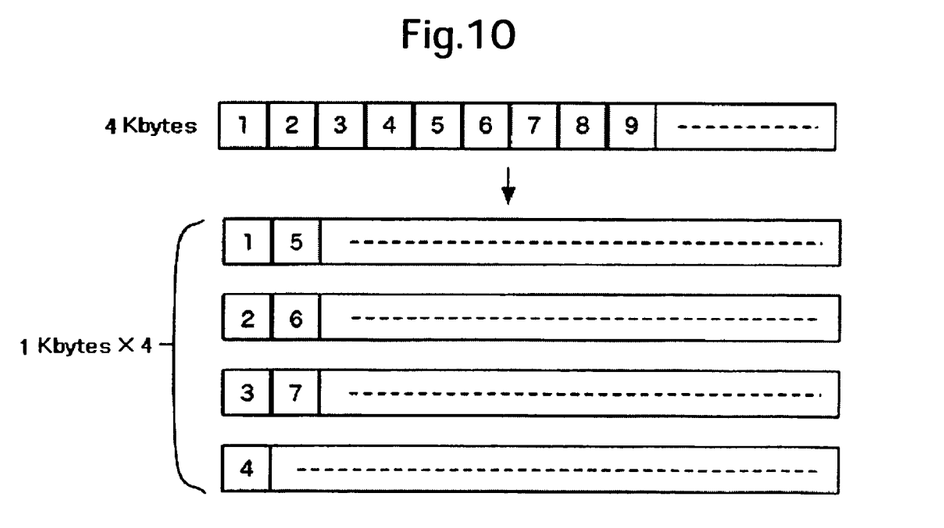
FIG. 10 illustrates an example of interleaving.

For example, if the unit of recording consists of 512 bytes of user data (and additional information), an error correction code may be added to each set of 4 kilobytes of user data and additional information, eight times the size of the unit of recording. Further, it is possible to add an error correction code to each of plural sets of such a size as 1 or 2 kilobytes apiece obtained by dividing the 4 kilobytes of user data through interleaving. Here, interleaving means to divide an original code sequence into plural sub-sequences as shown in FIG. 10. There, the original code sequence is divided into n sub-streams. The ith code string is assigned to the (r+1)th sub-sequence if dividing (i−1) by n leaves a remainder of r. In the example of FIG. 10, 4 kilobytes of data is divided into four 1-kilobytes of data. The first data is assigned to the first sub-sequence since dividing 0 (=1−1) by n=4 leaves a remainder r=0. Likewise, the second data is assigned to the second sub-sequence. The fifth data is assigned again to the first sub-sequence.

The coding device and decoding device of the embodiments can be applied to both longitudinal magnetic recording disk apparatus and perpendicular magnetic recording disk apparatus. Further, they can also be applied to magnetic optical disk apparatus and the like in addition to magnetic disk apparatus.

It is to be understood that the above description is intended to be illustrative and not restrictive. Many embodiments will be apparent to those of skill in the art upon reviewing the above description. The scope of the invention should, therefore, be determined not with reference to the above description, but instead should be determined with reference to the appended claims along with their full scope of equivalents.

What is claimed is:

1. A coding device comprising:
   a coder which, based on an M bits code string, produces an (M+1) bits coded string where each of the plural bits which may appear in the M bits code string is limited in run length;
   a preprocessor which produces an M bits code string by removing (N−M) bits respectively from predefined (N−M) positions of an incoming N bits code string and outputs the M bits code string to the coder; and
   a postprocessor which produces and outputs an (N+1) bits code string by inserting the (N−M) bits, which are removed by the preprocessor, into predefined (N−M) respective insertion positions of the (M+1) bits coded string output from the coder.

2. A coding device according to claim 1, wherein the predefined insertion positions do not mutually adjoin in the postprocessor.

3. A coding device according to claim 1, wherein:
   the preprocessor divides a code sequence longer than N into N bits code strings, produces M bits code strings by removing (N−M) bits from the predefined (N−M) positions of each N bits code string, and outputs the N bits code strings sequentially to the coder;
   from the incoming M bits code strings, the coder sequentially produces and outputs (M+1) bits coded strings in which each of the plural bits which may appear in the incoming M bits code strings is limited in run length;
   the postprocessor sequentially produces and outputs (N+1) bits code strings by inserting the (N−M) bits, which are removed by the preprocessor, into the predefined (N−M) respective insertion positions of each (M+1) bits coded string output from the coder; and
   the coding device further comprises an outputter which, from each of the (N+1) bits code strings sequentially output from the postprocessor, produces an output code string by replacing an L bits part of the (N+1) bits code string containing the predefined insertion positions by an L bits coded string in which each of the plural bits which may appear in the (N+1) bits code strings output from the postprocessor is limited in run length.

4. A coding device according to claim 3, wherein:
   at least one of the predefined insertion positions assumed by the postprocessor is the end of the (M+1) bits coded string output from the coder; and
   the outputter sequentially receives plural (N+1) bits code strings and produces output code strings by replacing an L bits part extending to plural (N+1) bits code strings by an L bits coded string in which each of the plural bits which may appear in the (N+1) bits code strings output from the postprocessor is limited in run length.

5. A coding device according to claim 1, wherein plural rules are defined for the insertion positions in view of the nature of the coded string output from the coder and the postprocessor selects one rule from the plural defined rules based on the coded string output from the coder and determines the (N−M) insertion positions based on the selected rule.

6. A disk apparatus comprising the coding device according to claim 1, wherein information to be recorded is coded by the coding device.

7. A disk apparatus according to claim 6, further comprising a decoding device for decoding information read from a disk, the decoding device comprising:
   a separator which receives an (N+1) bits code string and outputs an (M+1) bits code siring by removing (N−M) bits respectively from predefined (N−M) positions of the (N+1) bits code string;
   a first decoder which produces and outputs an M bits code string by decoding the (M+1) bits code string output from the separator; and
   a second decoder which produces and outputs a decoded string by inserting the (N−M) bits, which is removed by the separator, into respective predefined positions of the M bits code string output from the first decoder.

8. A disk apparatus according to claim 7, further comprising an error correction decoding block to perform PRML (partial response maximum likelihood) processing and error correction decode processing on the information read from the disk prior to processing by the decoding device.

9. A disk apparatus comprising the coding device according to claim 1, wherein the coding device not only encodes information to be recorded, but also adds an error correction code to each certain amount of information to be recorded which is equal to an integral multiple of a unit recording size.

10. A disk apparatus according to claim 9, wherein an error correction code is added to each of plural code sequences obtained by interleaving the information to be recorded whose size is an integral multiple of the unit recording size.

11. A disk apparatus according to claim 9, wherein the error correction code is added after the postprocessor produces and outputs the (N+1) bits code string.

12. A decoding device comprising:
  a separator which receives an (N+1) bits code string and outputs an (M+1) bits code string by removing (N−M) bits respectively from predefined (N−M) positions of the (N+1) bits code string;
  a first decoder which produces and outputs an M bits code string by decoding the (M+1) bits code string output from the separator; and
  a second decoder which produces and outputs a decoded string by inserting the (N−M) bits, which is removed by the separator, into respective predefined positions of the M bits code string output from the first decoder.

13. A read write section for a disk apparatus, the read write section comprising:
  a precoding block configured to perform QMTR (quasi-maximum transition run) coding on an incoming N bits code string to produce an (N+1) bits code string;
  an error correction coding block configured to concatenate code strings incoming sequentially from the precoding block, and perform error correction coding on the concatenated code string; and
  wherein the precoding block comprises:
  a coder which, based on an M bits code string, produces an (M+1) bits coded string where each of the plural bits which may appear in the M bits code string is limited in run length;
  a preprocessor which produces an M bits code string by removing (N−M) bits respectively from predefined (N−M) positions of an incoming N bits code string and outputs the M bits code string to the coder; and
  a postprocessor which produces and outputs an (N+1) bits code string by inserting the (N−M) bits, which are removed by the preprocessor, into predefined (N−M) respective insertion positions of the (M+1) bits coded string output from the coder.

14. A read write section according to claim 13, wherein the predefined insertion positions do not mutually adjoin in the postprocessor.

15. A read write section according to claim 13, wherein:
  the preprocessor divides a code sequence longer than N into N bits code strings, produces M bits code strings by removing (N−M) bits from the predefined (N−M) positions of each N bits code string, and outputs the M bits code strings sequentially to the coder;
  from the incoming M bits code strings, the coder sequentially produces and outputs (M+1) bits coded strings in which each of the plural bits which may appear in the incoming M bits code strings is limited in run length;
  the postprocessor sequentially produces and outputs (N+1) bits code strings by inserting the (N−M) bits, which are removed by the preprocessor, into the predefined (N−M) respective insertion positions of each (M+1) bits coded string output from the coder; and
  the coding device further comprises an outputter which, from each of the (N+1) bits code strings sequentially output from the postprocessor, produces an output code string by replacing an L bits part of the (N+1) bits code string containing the predefined insertion positions by an L bits coded string in which each of the plural bits which may appear in the (N+1) bits code strings output from the postprocessor is limited in run length.

16. A read write section according to claim 15, wherein:
  at least one of the predefined insertion positions assumed by the postprocessor is the end of the (M+1) bits coded string output from the coder; and
  the outputter sequentially receives plural (N+1) bits code strings and produces output code strings by replacing an L bits part extending to plural (N+1) bits code strings by an L bits coded string in which each of the plural bits which may appear in the (N+1) bits code strings output from the postprocessor is limited in run length.

17. A read write section according to claim 13, wherein plural rules are defined for the insertion positions in view of the nature of the coded string output from the coder and the postprocessor selects one rule from the plural defined rules based on the coded string output from the coder and determines the (N−M) insertion positions based on the selected rule.

18. A read write section according to claim 13, further comprising:
  an error correction decoding block to perform PRML (partial response maximum likelihood) processing and error correction decode processing on the information read from the disk prior to processing by the decoding device; and
  a postdecoding block configured to perform QMTR decoding on a code sequence from the error correction decoding block to produce a decoded string.

19. A read write section according to claim 18, wherein the postdecoding block comprises:
  a separator which receives an (N+1) bits code string and outputs an (M+1) bits code string by removing (N−M) bits respectively from predefined (N−M) positions of the (N+1) bits code string;
  a first decoder which produces and outputs an M bits code string by decoding the (M+1) bits code string output from the separator; and
  a second decoder which produces and outputs a decoded string by inserting the (N−M) bits, which is removed by the separator, into respective predefined positions of the M bits code string output from the first decoder.

* * * * *

UNITED STATES PATENT AND TRADEMARK OFFICE
CERTIFICATE OF CORRECTION

PATENT NO. : 7,268,707 B2
APPLICATION NO. : 11/394531
DATED : September 11, 2007
INVENTOR(S) : Takashi et al.

It is certified that error appears in the above-identified patent and that said Letters Patent is hereby corrected as shown below:

In the Claims:
Claim 3, Column 8, Line 8, please delete "positions of each N bits code string, and outputs the N" and insert --positions of each N bits code string, and outputs the M--.

Claim 7, Column 8, Line 51, please delete "siring" and insert --string--.

Signed and Sealed this

Sixth Day of May, 2008

JON W. DUDAS
*Director of the United States Patent and Trademark Office*